United States Patent
Holonyak, Jr. et al.

(10) Patent No.: US 7,711,015 B2
(45) Date of Patent: May 4, 2010

(54) METHOD FOR CONTROLLING OPERATION OF LIGHT EMITTING TRANSISTORS AND LASER TRANSISTORS

(75) Inventors: Nick Holonyak, Jr., Urbana, IL (US); Milton Feng, Champaign, IL (US); Gabriel Walter, Urbana, IL (US)

(73) Assignee: The Board of Trustees of The University of Illinois, Urbana, IL (US)

( * ) Notice: Subject to any disclaimer, the term of this patent is extended or adjusted under 35 U.S.C. 154(b) by 240 days.

(21) Appl. No.: 11/805,859

(22) Filed: May 24, 2007

(65) Prior Publication Data

US 2008/0240173 A1    Oct. 2, 2008

Related U.S. Application Data

(60) Provisional application No. 60/921,425, filed on Apr. 2, 2007.

(51) Int. Cl.
*H01S 3/113* (2006.01)

(52) U.S. Cl. ................. 372/11; 372/1; 372/30; 372/38.03

(58) Field of Classification Search .......... 372/11, 372/1, 30
See application file for complete search history.

(56) References Cited

U.S. PATENT DOCUMENTS

| | | | |
|---|---|---|---|
| 2,569,347 A | 9/1951 | Shockley | |
| 4,485,391 A | 11/1984 | Poulain et al. | 357/19 |
| 4,710,936 A | 12/1987 | Shibata et al. | 372/45 |
| 4,845,535 A | 7/1989 | Yamanishi et al. | 315/172 |
| 4,958,208 A | 9/1990 | Tanaka | 357/34 |
| 5,003,366 A | 3/1991 | Mishima et al. | 357/34 |
| 5,239,550 A | 8/1993 | Jain | 372/45 |
| 5,293,050 A | 3/1994 | Chapple-Sokol et al. | 257/17 |
| 5,334,854 A | 8/1994 | Ono et al. | 257/13 |
| 5,389,804 A | 2/1995 | Yokoyama et al. | 257/197 |
| 5,399,880 A | 3/1995 | Chand | 257/21 |
| 5,414,273 A | 5/1995 | Shimura et al. | 257/17 |
| 5,588,015 A | 12/1996 | Yang | 372/45.012 |
| 5,684,308 A | 11/1997 | Lovejoy et al. | 257/184 |
| 5,723,872 A | 3/1998 | Seabaugh et al. | 257/25 |

(Continued)

FOREIGN PATENT DOCUMENTS

JP    61231788    10/1986

(Continued)

OTHER PUBLICATIONS

Light-Emitting Transistor: Light Emission From InGaP/GaAs Heterojunction Bipolar Transistors, M. Feng, N. Holonyak, Jr., and W. Hafez, Appl. Phys. Lett. 84, 151 (2004).

(Continued)

*Primary Examiner*—Dung T Nguyen
(74) *Attorney, Agent, or Firm*—Martin Novack

(57) ABSTRACT

A method for controlling operation of a transistor includes the following steps: providing a bipolar transistor having emitter, base and collector regions; applying electrical signals to the transistor to produce light emission from the transistor; effecting photon-assisted tunneling of carriers in the transistor with self-generated photons of the light emission, and controlling operation of the transistor by controlling the photon-assisted tunneling.

29 Claims, 11 Drawing Sheets

U.S. PATENT DOCUMENTS

| | | | | |
|---|---|---|---|---|
| 5,780,880 | A | 7/1998 | Enquist | 257/197 |
| 5,796,714 | A | 8/1998 | Chino et al. | 372/50 |
| 6,337,494 | B1 | 1/2002 | Ryum et al. | 257/197 |
| 6,479,844 | B2 | 11/2002 | Taylor | 257/192 |
| 6,737,684 | B1 | 5/2004 | Takagi et al. | 257/194 |
| 6,974,969 | B2 | 12/2005 | Taylor | 257/24 |
| 7,091,082 | B2 | 8/2006 | Feng et al. | 438/235 |
| 7,286,583 | B2 | 10/2007 | Feng et al. | 372/30 |
| 2002/0030195 | A1 | 3/2002 | Yoshii et al. | 257/101 |
| 2005/0040387 | A1* | 2/2005 | Feng et al. | 257/14 |
| 2005/0040432 | A1 | 2/2005 | Feng et al. | 257/198 |
| 2005/0054172 | A1 | 3/2005 | Feng et al. | 438/313 |
| 2006/0208290 | A1 | 9/2006 | Feng et al. | 257/292 |
| 2007/0201523 | A1 | 8/2007 | Walter et al. | 372/43 |
| 2009/0115346 | A1* | 5/2009 | Walter et al. | 315/291 |

FOREIGN PATENT DOCUMENTS

| | | |
|---|---|---|
| JP | 2007067023 | 3/2007 |
| WO | WO2005/020287 | 3/2005 |
| WO | WO2006/093883 | 8/2006 |

OTHER PUBLICATIONS

Quantum-Well-Base Heterojunction Bipolar Light-Emitting Transistor, M. Feng, N. Holonyak, Jr., and R. Chan, Appl. Phys. Lett. 84, 1952 (2004).

Type-II GaAsSb/InP Heterojunction Bipolar Light-Emitting Transistor, M. Feng, N. Holonyak, Jr., B. Chu-Kung, G. Walter, and R. Chan, Appl. Phys. Lett. 84, 4792 (2004).

Laser Operation Of A Heterojunction Bipolar Light-Emitting Transistor, G. Walter, N. Holonyak, Jr., M. Feng, and R. Chan, Appl. Phys. Lett. 85, 4768 (2004).

Microwave Operation And Modulation Of A Transistor Laser, R. Chan, M. Feng, N. Holonyak, Jr., and G. Walter, Appl. Phys. Lett. 86, 131114 (2005).

Room Temperature Continuous Wave Operation Of A Heterojunction Bipolar Transistor Laser, M. Feng, N. Holonyak, Jr., G. Walter, and R. Chan, Appl. Phys. Lett. 87, 131103 (2005).

Visible Spectrum Light-Emitting Transistors, F. Dixon, R. Chan, G. Walter, N. Holonyak, Jr., M. Feng, X. B. Zhang, J. H. Ryou, and R. D. Dupuis, Appl. Phys. Lett. 88, 012108 (2006).

The Transistor Laser, N. Holonyak, M Feng, Spectrum, IEEE vol. 43, Issue 2, Feb. 2006.

Signal Mixing In A Multiple Input Transistor Laser Near Threshold, M. Feng, N. Holonyak, Jr., R. Chan, A. James, and G. Walter, Appl. Phys. Lett. 88, 063509 (2006).

Collector Current Map Of Gain And Stimulated Recombination On The Base Quantum Well Transitions Of A Transistor Laser, R. Chan, N. Holonyak, Jr., A. James, G. Walter, Appl. Phys. Lett. 88, 143508 (2006).

Collector Breakdown In The Heterojunction Bipolar Transistor laser, G. Walter, A. James, N. Holonyak, Jr., M. Feng, and R. Chan, Appl. Physics Lett. 88, 232105 (2006).

High-Speed ($\geq$1 GHz) Electrical and Optical Adding, Mixing, and Processing of Square-Wave Signals With a Transistor Laser, M. Feng, N. Holonyak, Jr., R. Chan, A. James, and G. Walter, IEEE Photonics Technology Lett., vol. 18, No. 11, Jun. 1, 2006.

Graded-Base InGaN/GaN Heterojunction Bipolar Light-Emitting Transistors, B.F. Chu-Kung, M. Feng, G. Walter, and J. Holonyak, Jr. et al., Appl. Physics Lett. 89, 082108 (2006).

Carrier Lifetime And Modulation Bandwidth of A Quantum Well AlGaAs/InGaP/GaAs/InGaAs Transistor Laser, M. Feng, N. Holonyak, Jr., A. James, K. Cimino, G. Walter, and R. Chan, Appl. Phys. Lett 89, 113504 (2006).

Chirp In A Transistor laser: Franz-Keldysh Reduction of The Linewidth Enhancement, G. Walter, A. James, N. Holonyak, Jr., and M. Feng, App. Phys. Lett. 90, 091109 (2007).

S. L. Miller and J. J. Ebers, Bell Syst. Tech. J. 34, 883 (1955).

J. L. Moll, M. Tanenbaum, J. M. Goldey, and N. Holonyak, Proc. IRE 44, 1174 (1956).

P. Grossman, and J. Choma, Jr., "Large Signal Modeling of HBT's Including Self-Heating and Transit Time Effects" IEEE Transactions On Microwave Theory And Techniques, vol. 40, No. 3, Mar. 1992.

Y. Mori, J. Shibata, Y. Sasai, H. Serizawa, and T. Kajiwar, "Operation Principle Of The InGaAsP/InP Laser Transistor", Appl. Phys. Lett. 47(7), Oct. 1, 1985.

J. Genoe, C. Van Hoof, K. Fobelets, R. Mertens, and G. Borghs, "pnp Resonant Tunneling Light Emitting Transistor" Appl. Phys. Lett. 62 (9), Aug. 31, 1992.

P. Berger, N. Chand, and N. Dutta, "An AlGaAs Double-Heterojunction Bipolar Transistor Grown By Molecular-Beam Epitaxy", Appl. Phys. Lett. 59 (9), Aug. 26, 1991.

E. Zanoni, L. Vendrame, and P. Pavan, "Hot-Electron Electroluminescence in AlGaAs/GaAs Heterojunction Bipolar Transistors", Appl. Phys. Lett. 62 (4), Jan. 25, 1993.

M. Harris, B. Wagner, S. Halpern and M. Dobbs, "Full Two-Dimensional Electroluminescent (EL) Analysis of GaAs/AlGaAs HBTs", IEEE 99CH36296. 37th Annual International Reliability Physics Symposium, San Diego., California, 1999.

K. Wang, P. Asbeck, M. Chang, G. Sullivan, and D. Millar, "Noninterfering Optical Method Of HBT Circuit Evaluation", Electronics Letters, vol. 25 No. 17, Aug. 17, 1989.

J. Bardeen and W.H. Brattain, "The Transistor, A Semi-conductor Triode," Physical Review 74, (1948).

W. Shockley, "The Theory of p-n Junctions in Semiconductors and p-n Junction Transistors," Bell System Technology Journal 28, 435-489 (1949).

R.N. Hall, G.E. Fenner, J.D. Kingsley, T.J. Soltys, and R.O. Carlson, "Coherent Light Emission From GaAs Junctions," Phys. Rev. Lett., vol. 9. pp. 366-368, Nov. 1, 1962.

M.I. Nathan, W.P. Dumke, G. Burns, F.H. Dill, Jr., and G. Lasher, "Stimulated Emission of Radiation From GaAs p-n Junction," Appl. Phys. Lett., vol. 1, pp. 62-64. Nov. 1962.

N. Holonyak, Jr. and S.F. Bevacqua, "Coherent (Visible) Light Emission From GaAs$_{1-x}$P$_x$ Junctions," Appl. Phys. Lett., vol. 1, pp. 82-83, Dec. 1962.

T.M. Quist, R.H. Rediker, R.J. Keyes, W.E. Krag, B. Lax, A.L. McWhorter, and H.J. Zeiger, "Semiconductor Maser of GaAs," Appl. Phys. Lett., vol. 1. pp. 91-92, Nov. 1962.

H. Kroemer, "Theory Of A Wide-Gap Emitter For Transistors," Proceedings of the IRE 45, 1535-1537 (1957).

W. Hafez, J.W. Lai and M. Feng, "InP/InGaAs SHBTs with 75 nm Collector and fr>500 GHz", Electronic Letters, vol. 39, No. 20, Oct. 2003.

W. Hafez, J.W. Lai, and M. Feng "Record $f_T$ and $f_T + f_{MAX}$ Performance of InP/InGaAs Single Heterojunction Bipolar Transistors," Electronics Letters, May 2003.

W. Hafez, J.W. Lai, and M. Feng. "Sub-micron InP/InGaAs Single Heterojunction Bipolar Transistors With $f_T$ of 377 GHz," IEEE Electron Device Letters, May 2003.

W. Hafez, J.W. Lai and M. Feng, "Vertical scaling of 0.25 um Emitter InP/InGaAs Single Heterojunction Bipolar Transistors With $f_T$ of 452 GHz," IEEE Electron Devices Letters, Jul. 2003.

P. Enquist, A. Paolella, A.S. Morris, F.E. Reed, L. DeBarros, A.J. Tessmer, and J.A. Hutchby, "Performance Evaluation Of Heterojunction Bipolar Transistors Designed For High Optical Gain", Research Triangle Institute, Research Triangle Park, NC, ARL, Research Laboratory, Ft. Monmouth, NJ, Applied Research and Technology, Wake Forest, NC, , IEEE, pp. 278-287, 1995.

Yukihiko Arai, Masaaki Sakuta, Hiroshi Takano, Takashi Usikubo, Ryozo Furukawa, and Masao Kobayashi, "Optical Devices From AlGaAs-GaAs HBTs Heavily Doped With Amphoteric Si", IEEE Transactoins On Electron Devices, pp. 632-638, Vo. 42. No. 4, Apr. 1995.

G.W. Taylor, R.S. Mand, J.G. Simmons, and A.Y. Cho, "Ledistor—A Three-Terminal Double Heterostructure Optoelectronic Switch", Appl. Phys. Lett. 50 (6), Feb. 9, 1987.

N. Holonyak "Quantum-Well And Superlattice Lasers: Fundamental Effects" pp. 1-18, in "The Physics of Submicron Structures", Plenum Press, 1984.

V. Ryzhii, M. Willander, M. Ryzhii and I. Khmyrova, "Heterostructure Laser-Transistors Controlled By Resonant-Tunnelling Electron Extraction", Semicond. Sci. Technol. 12 (1997) 431-438.

V. Ryzhi and I. Khmyrova, "Bistability Effect in Laser-Transistor Resonant-Tunneling Structure" Solid-State Electronics vol. 37 Nos. 4-6 pp. 1259-1262, 1994.

R. Bhat, W.-P. Hong, C. Caneau, M. A. Koza, C.-K. Nguyen, and S. Goswami, "InP/GaAsSb/InP And lnP/GaAsSb/InGaAsP Double Heterojunction Bipolar Transistors With A Carbon-Doped Base Grown By Organometallic Chemical Vapor Deposition" Appl. Phys. Lett. 68, 985 (1996).

T. McDermott, E. R. Gertner, S. Pittman, C. W. Seabury, and M. F. Chang, "Growth And Doping Of GaAsSb Via Metalorganic Chemical Vapor Deposition For InP Heterojunction Bipolar Transistors" Appl. Phys. Lett. 58, 1386 (1996).

Dvorak, C. R. Bolognesi, O. J. Pitts, and S. P. Watkins, "300 GHz InP/GaAsSb/InP Double HBTs With High Current Capability And $BV_{CEO} \geq 6 V$" IEEE Elec. Dev. Lett. 22, 361 (2001).

V. de Walle, "Band Lineups And Deformation Potentials In The Model-Solid Theory" Physical Review B 39, 1871 (1989).

M. Feng, N. Holonyak, Jr. and W. Hafez, "Light-Emitting Transistor: : Light Emission From InGaP/GaAs Heterojunction Bipolar Transistors", Appl. Phys. Lett. 84, 151, Jan. 5, 2004.

J. Shibata, Y. Mori, Y. Sasai, N. Hase, H. Serizawa, and T. Kahwara "Fundamental Characteristics Of An InGaAsP/InP Laser Transistor", Electronic Letters, vol. 21, p. 98, 1985.

F. Jain, C. Chung, R. LaComb and M. Gokhale, "Resonant Tunneling Transistor Lasers: A New Approach To Obtain Multi-State Switching And Bistable Operation", International Journal Of Infrared And Millimeter Waves, Springer, Dordrecht, NL, vol. 14, No. 6, pp. 1311-1322, Jun. 1993.

Chun-Xia Du, Farice Duteil, Goran Hansson, and Wei-Xin Ni, "Si/SiGe/Si: Er: O Light-Emitting Transistors Prepared By Differential Molecular-Beam Epitaxy", App. Phys. Letts., vol. 78, No. 12, Mar. 19, 2001.

J. Hu et al., "Type II Photoluminescence And Conduction Band Offsets of GaAsSb/InGaAs and GaAsSb/InP Heterostructures Grown By Metalorganic Vapor Phase Epitaxy" Applied Physics Letters, 73(19) Nov. 1998.

Y. Yamashita et al., "Pseudomorphic $In_{0.52}Al_{0.48}As/In_{0.7}Ga_{0.3}As$ HEMTs With an Ultrahigh $f_T$ of 562 GHz", IEEE Electron Device Lett. 23 (10), 573-575 (2002).

* cited by examiner

| Layer | Comment | Material | x | Thickness (A) | Type | Dopant | Level (/cm³) |
|---|---|---|---|---|---|---|---|
| 23 | Emitter Contact | GaAs | | 1000 | N+ | Si | 5.0E+18 |
| 22 | Confining | Al(x)Ga(1-x)As | 0.35 | 500 | N | Si | 3.0E+18 |
| 21 | Confining | Al(x)Ga(1-x)As | 0.6 | 300 | N | Si | 3.0E+18 |
| 20 | Confining | Al(x)Ga(1-x)As | 0.95 | 4090 | N | Si | 3.0E+18 |
| 19 | Confining | Al(x)Ga(1-x)As | 0.6 | 150 | N | Si | 5.0E+17 |
| 18 | Confining | Al(x)Ga(1-x)As | 0.35 | 150 | N | Si | 5.0E+17 |
| 17 | Emitter | In(x)Ga(1-x)P | 0.49 | 150 | N- | Si | 5.0E+17 |
| 16 | Base Contact | Al(x)Ga(1-x)As | 0.12 | 100 | P+ | C | 5.0E+19 |
| 15 | Base | Al(x)Ga(1-x)As | 0.12 | 100 | P+ | C | 2.0E+19 |
| 14 | Base | Al(x)Ga(1-x)As | 0.12 | 300 | P+ | C | 1.0E+19 |
| 13 | Base | GaAs | | 10 | P | - | 5.0E+17 |
| 12 | Base | In(x)Ga(1-x)As | 0.1 | 20 | i | - | UID |
| 11 | Base | In(x)Ga(1-x)As | 0.2 | 150 | i | - | UID |
| 10 | Base | In(x)Ga(1-x)As | 0.1 | 20 | i | - | UID |
| 9 | Base | GaAs | | 10 | P | - | 5.0E+17 |
| 8 | Base | Al(x)Ga(1-x)As | 0.12 | 300 | P+ | C | 2.0E+19 |
| 7 | Collector | Al(x)Ga(1-x)As | 0.12 | 600 | N- | Si | 2.0E+16 |
| 6 | Etch Stop | In(x)Ga(1-x)P | 0.49 | 120 | N | Si | 3.0E+16 |
| 5 | Collector Contact | Al(x)Ga(1-x)As | 0.12 | 200 | N+ | Si | 5.0E+18 |
| 4 | Confining | Al(x)Ga(1-x)As | 0.4 | 150 | N | Si | 5.0E+18 |
| 3 | Confining | Al(x)Ga(1-x)As | 0.95 | 5000 | N | Si | 5.0E+18 |
| 2 | Confining | Al(x)Ga(1-x)As | 0.4 | 634 | N | Si | 5.0E+18 |
| 1 | BUffer | GaAs | | 3000 | N | Si | 5.0E+18 |
| | Substrate | 4" GaAs | | | SI (US) | | |

Figure 7

METHOD FOR CONTROLLING OPERATION OF LIGHT EMITTING TRANSISTORS AND LASER TRANSISTORS

RELATED APPLICATION

Priority is claimed from U.S. Provisional Patent Application No. 60/921,425, filed Apr. 2, 2007, and said U.S. Provisional Patent Application is incorporated herein by reference.

GOVERNMENT RIGHTS

The present invention was made with government support, and the government has certain rights in the invention.

FIELD OF THE INVENTION

This invention relates to controlling operation of transistors, especially heterojunction bipolar transistors that can operate as light-emitting transistors and laser transistors.

BACKGROUND OF THE INVENTION

A part of the background hereof lies in the development of light emitters based on direct bandgap semiconductors such as III-V semiconductors. Such devices, including light emitting diodes and laser diodes, are in widespread commercial use.

Another part of the background hereof lies in the development of wide bandgap semiconductors to achieve high minority carrier injection efficiency in a device known as a heterojunction bipolar transistor (HBT). These transistor devices are capable of operation at extremely high speeds. For example, InP HBTs have, in recent years, been demonstrated to exhibit operation at speeds above 500 GHz.

Another part of the background hereof lies in the development of heterojunction bipolar transistors which operate as light-emitting transistors and laser transistors. Reference can be made for example, to U.S. Pat. No. 7,091,082 and to the following: U.S. patent application Ser. No. 10/646,457, filed Aug. 22, 2003; U.S. patent application Ser. No. 10/861,320, filed Jun. 4, 2004; U.S. patent application Ser. No. 11/068,561, filed Feb. 28, 2005; U.S. patent application Ser. No. 11/175,995, filed Jul. 6, 2005; and U.S. patent application Ser. No. 11/364,893, filed Feb. 27, 2006; PCT International Patent Publication Number WO/2005/020287, published Mar. 3, 2005, and PCT International Patent Publication Number WO/2006/006879 published Aug. 9, 2006; all the foregoing being assigned to the same assignee as the present Application. Reference can also be made, for example, to the following publications: Light-Emitting Transistor: Light Emission From InGaP/GaAs Heterojunction Bipolar Transistors, M. Feng, N. Holonyak, Jr., and W. Hafez, Appl. Phys. Lett. 84, 151 (2004); Quantum-Well-Base Heterojunction Bipolar Light-Emitting Transistor, M. Feng, N. Holonyak, Jr., and R. Chan, Appl. Phys. Lett. 84, 1952 (2004); Type-II GaAsSb/InP Heterojunction Bipolar Light-Emitting Transistor, M. Feng, N. Holonyak, Jr., B. Chu-Kung, G. Walter, and R. Chan, Appl. Phys. Lett. 84, 4792 (2004); Laser Operation Of A Heterojunction Bipolar Light-Emitting Transistor, G. Walter, N. Holonyak, Jr., M. Feng, and R. Chan, Appl. Phys. Lett. 85, 4768 (2004); Microwave Operation And Modulation Of A Transistor Laser, R. Chan, M. Feng, N. Holonyak, Jr., and G. Walter, Appl. Phys. Lett. 86, 131114 (2005); Room Temperature Continuous Wave Operation Of A Heterojunction Bipolar Transistor Laser, M. Feng, N. Holonyak, Jr., G. Walter, and R. Chan, Appl. Phys. Lett. 87, 131103 (2005); Visible Spectrum Light-Emitting Transistors, F. Dixon, R. Chan, G. Walter, N. Holonyak, Jr., M. Feng, X. B. Zhang, J. H. Ryou, and R. D. Dupuis, Appl. Phys. Lett. 88, 012108 (2006); The Transistor Laser, N. Holonyak, M Feng, Spectrum, IEEE Volume 43, Issue 2, February 2006; Signal Mixing In A Multiple Input Transistor Laser Near Threshold, M. Feng, N. Holonyak, Jr., R. Chan, A. James, and G. Walter, Appl. Phys. Lett. 88, 063509 (2006); and Collector Current Map Of Gain And Stimulated Recombination On The Base Quantum Well Transitions Of A Transistor Laser, R. Chan, N. Holonyak, Jr., A. James, G. Walter, Appl. Phys. Lett.

Some history will next be summarized as part of the background hereof. Employing both electrons and holes, intrinsically bipolar, the transistor operates by injecting minority carriers into the base (B) at the emitter (E, current $I_E$), recombining some of the carriers in the base ($I_B=[1-\alpha]I_E$), and transporting the remainder ($I_C=\alpha I_E$, $0<\alpha \leq 1$, $I_E+I_B+I_C=0$) to the higher impedance collector (C), thus forming a "transfer resistor" (obviously the 1947 bipolar active device dubbed the "transistor", (see J. Bardeen and W. H. Brattain, Phys. Rev. 74, 230, 1948), the historic prototype and still relevant). In contrast to the emitter-to-collector carrier (current) transfer fraction $\alpha$, the transistor common-emitter gain $\beta$ can be quite large, and is $\beta \equiv I_C/I_B = \alpha/[1-\alpha]$. Just from its geometry, a simple n-type "slab" of Ge (only a semiconductor base "slab" and a point contact input and output—see J. Bardeen et al., supra), it can be see at once why Bardeen designated the emitter current as $I_E$, the base current $I_B$, and the collector current $I_C$ ($I_E$, $I_B$, $I_C$). It can be recognized immediately, from the all-base Ge "slab" (see, again, Bardeen et al., supra), that the "magic" of the transistor is intrinsically in the base. And, it is the base that potentially offers more, as demonstrated, for example, by the direct-gap, high-speed, high-current-density ($I_C \sim 10^6$ A/cm$^2$) heterojunction bipolar transistor (HBT) (see, e.g., M. Feng, N. Holonyak, Jr., and W. Hafez, Appl. Phys. Lett. 84, 151 (2004); M. Feng, N. Holonyak, Jr., and R. Chan, Appl. Phys. Lett. 84, 1952 (2004)), a direct descendant of the Bardeen and Brattain transistor, and realize the base although thin (10-100 nm), has room for more layering (bandgap and doping) and can be modified. At the high current density of the high-speed direct-gap HBT, and thus a high enough base current to be interesting (even with $\beta \sim 100$), it has been demonstrated that significant recombination radiation can be expected (see, again, e.g., M. Feng, N. Holonyak, Jr., and W. Hafez, Appl. Phys. Lett. 84, 151 (2004); M. Feng, N. Holonyak, Jr., and R. Chan, Appl. Phys. Lett. 84, 1952 (2004)). In fact, employing quantum wells (QWs) and cavity reflection, it has been demonstrated that it is possible to re-invent the base region and its mechanics (its carrier recombination and transport fraction), reduce the $\beta$ gain (from ~100 to ~10), and achieve stimulated recombination, i.e., realize a transistor laser (see, e.g. G. Walter, N. Holonyak, Jr., M. Feng, and R. Chan, Appl. Phys. Lett. 85, 4768 (2004); M. Feng, N. Holonyak, Jr., G. Walter, and R. Chan, Appl. Phys. Lett. 87, 131103 (2005)). This resulted in a unique transistor in form and operation, as well as a unique three-terminal laser.

It is among the objects of the present invention to provide improved techniques for operation of light emitting transistors and laser transistors or transistor lasers. (The terms laser transistors and transistor lasers are used interchangeably throughout.)

SUMMARY OF THE INVENTION

In a transistor laser, beyond a certain threshold base recombination current $I_B = I_{th}$ (see the upper left-hand corner of the $I_C$-$V_{CE}$ characteristics of FIG. 9), stimulated recombination causes compression in the collector $I_C$-$V_{CE}$ characteristics and reduction in the gain β ($β_{stim}$<$β_{spon}$) (see e.g. M. Feng, N. Holonyak, Jr., G. Walter, and R. Chan, Appl. Phys. Lett. 87, 131103 (2005)). As described further hereinbelow, in the region of stimulated emission ($I_B$>$I_{th}$, $β_{stim}$<$β_{spon}$) much more structure is evident in the $I_C$-$V_{CE}$ characteristics owing to the sensitivity to QW bandfilling, state change, spectral change (coherent/incoherent, or i/c), mode-hopping (c/c), change in optical field strength, and the effect of photon-assisted collector tunneling. If the base region cavity Q (e.g., a relatively long narrow device) is spoiled, the $I_C$-$V_{CE}$ characteristics revert to those of normal transistor behavior ($β_{stim}$→$β_{spon}$) (see e.g. R. Chan, M. Feng, N. Holonyak, Jr., A. James, G. Walter, Appl. Phys. Lett. 88, 143508 (2006)), confirming the basis of the transistor laser and how it employs carrier transport (E→C) and QW-enhanced base recombination.

In accordance with as aspect of the present invention, operation of a bipolar transistor, which in many applications hereof will be a light-emitting bipolar transistor or laser transistor, is controlled by effecting photon-assisted tunneling of carriers in the transistor, using photons generated by the transistor itself ("self-generated photons), and controlling the photon-assisted tunneling. Techniques can be employed, for example, for attenuating and/or enhancing the photon-assisted tunneling, depending on the application.

In a form of the invention, a method is set forth for controlling operation of a transistor, include the following steps: providing a bipolar transistor having emitter, base and collector regions; applying electrical signals to the transistor to produce light emission from the transistor; effecting photon-assisted tunneling of carriers in the transistor with self-generated photons of said light emission, and controlling operation of the transistor by controlling said photon-assisted tunneling. The controlling of photon-assisted tunneling can comprise attenuating and/or enhancing photon-assisted tunneling. In an embodiment of this form of the invention, the step of controlling said photon-assisted tunneling includes applying a control signal voltage to the transistor to render the collector junction of the transistor more absorptive to said self-generated photons of said light emission. Also in an embodiment hereof, the step of applying said control signal voltage comprises applying an increase in emitter-collector voltage to said transistor to render the collector junction more absorptive to said self-generated photons of said light emission. In a form of this embodiment, the step of applying an increase in emitter-collector voltage is continued to implement a state of discontinuous switching from higher to lower emitter-collector voltage at higher collector current. Also in a form of this embodiment, the step of applying an increase in emitter-collector voltage is implemented at substantially constant base current.

In a disclosed embodiment of the invention, the step of providing a bipolar transistor having emitter, base, and collector regions comprises providing a heterojunction bipolar transistor having a base region thickness in the range of about 10 to 100 nm. In a preferred form of this embodiment, the step of providing a bipolar transistor having emitter, base, and collector regions includes providing a base region that exhibits quantum size effects.

In accordance with a further form of the invention, a method is set forth for producing controlled laser emission, including the following steps: providing a bipolar transistor having emitter, base and collector regions; disposing at least a portion of said transistor in an optical cavity; applying electrical signals to said transistor to produce laser emission from said transistor; effecting photon-assisted tunneling of carriers in said transistor with self-generated photons of said laser emission, and controlling said laser emission from said transistor by controlling said photon-assisted tunneling. In an embodiment of this form of the invention, at least the base region of said transistor is disposed within said cavity, and said step of applying electrical signals to said transistor to produce laser emission comprises effecting stimulated emission from said base region. Again, the controlling of photon-assisted tunneling can comprise attenuating and/or enhancing photon-assisting tunneling. In an embodiment of this form of the invention, the step of controlling said photon assisted tunneling includes applying a control signal voltage to said transistor to render the collector junction of the transistor more absorptive to said self-generated photons of said laser emission. Also, in an embodiment of this form of the invention, the step of applying said control signal voltage comprises applying an increase in emitter-collector voltage to said transistor to render the collector junction more absorptive to said self-generated photons of said light emission. In a form of this embodiment, the step of applying an increase in emitter-collector voltage is continued to implement switching from coherent to spontaneous emission. Also in a form of this embodiment the step of applying an increase in emitter-collector voltage is continued to implement a state of switching from higher to lower optical output.

Further features and advantages of the invention will become more readily apparent from the following detailed description when taken in conjunction with the accompanying drawings.

BRIEF DESCRIPTION OF THE DRAWINGS

FIG. 6(*c*) shows that when a large enough field (reverse bias) is applied across the depletion region, the photons are absorbed with Franz-Keldysh-effect assistance (photon-assisted tunneling). The larger the field, the higher the absorption coefficient.

FIG. 7 is a chart showing the epitaxial layers of a transistor laser device used in examples hereof.

DETAILED DESCRIPTION

Figure 1:
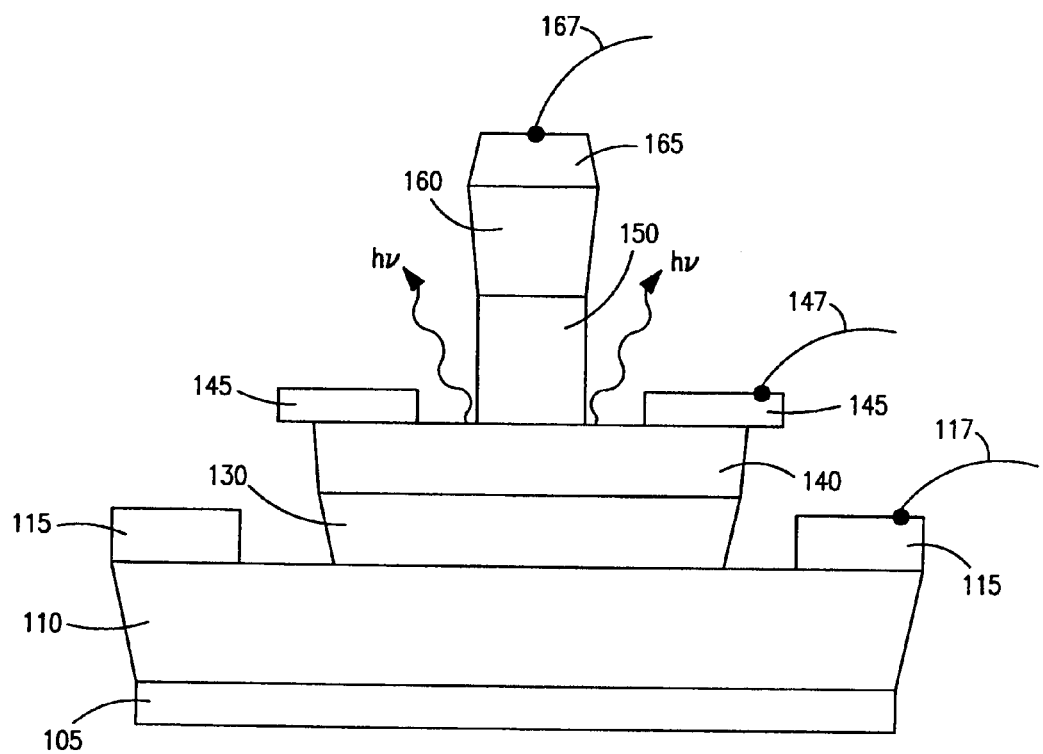
FIG. 1 is a simplified cross-sectional diagram, not to scale, of a light-emitting transistor or laser transistor, as described in referenced PCT International Patent Application Publications.

FIG. 1 illustrates a light emitting transistor device of a type described in PCT International Patent Application Publication WO/2005/020287 and in PCT International Patent Application Publication WO/2006/093883, both of these PCT Published International Patent Applications being incorporated herein by reference. A substrate 105 has the following layers disposed thereon: subcollector 110, n-type GaAs collector 130, 600 Angstrom p+ compositionally graded InGaAs base 140, n-type InGaP emitter 150, and cap layer 160. Also shown are collector metallization (or electrode) 115, base metallization 145, and emitter metallization 165. Collector lead 117, base lead 147, and emitter lead 167 are also shown. As described in the referenced PCT Published International Patent Applications, for conventional PN junction diode operation, the recombination process is based on both an electron injected from the n-side and a hole injected from the p-side, which in a bimolecular recombination process can be limited in speed. In the case of HBT light emission (as represented in FIG. 1 as light emission from base region 140) the base "hole" concentration is so high that when an electron is injected into the base, it recombines (bimolecular) rapidly. The base current merely re-supplies holes via relaxation to neutralize charge imbalance.

Figure 2:
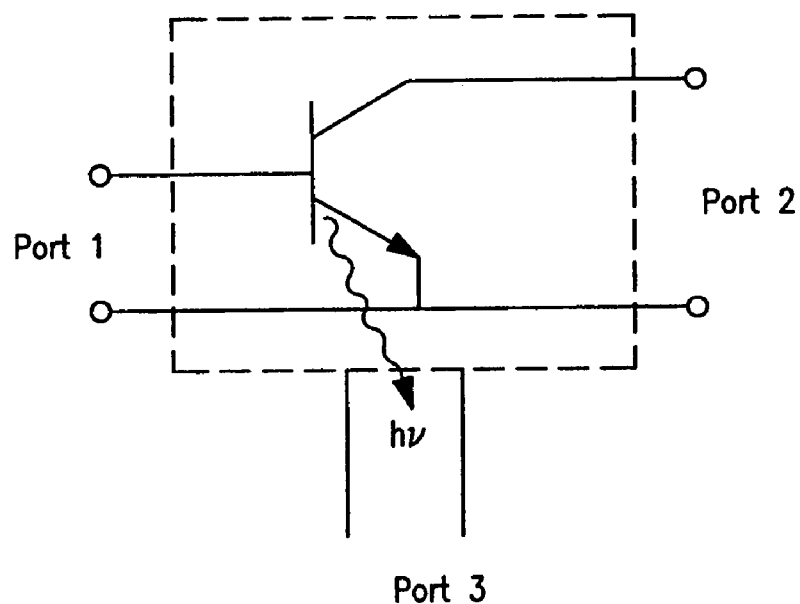
FIG. 2 is a simplified schematic diagram of a three port light-emitting transistor device as disclosed in the referenced PCT International Patent Application Publication WO/2005/020287.

As is also described in the referenced PCT International Patent Application Publications WO/2005/020287 and WO/2006/093883, in typical transistor operation, one of the three terminals of a transistor is common to both the input and output circuits. This leads to familiar configurations known as common emitter (CE), common base (CB), and common collector (CC). The common terminal (often ground reference) can be paired with one or the other of the two remaining terminals. Each pair is called a port, and two pairs for any configurations are called a two-port network. The two ports are usually identified as an input port and as an output port. As also described in the referenced PCT Published International Patent Applications, and as illustrated in FIG. 2, a third port, namely an optical output port, is provided, and is based on (recombination-radiation) emission from the base layer of the HBT light emitter. For the HBT of FIG. 1 operated, for example, with a common emitter configuration, when an electrical signal is applied to the input port (Port 1), there results simultaneously an electrical output with signal amplification at Port 2 and optical output with signal modulation of light emission at Port 3.

Figure 3:
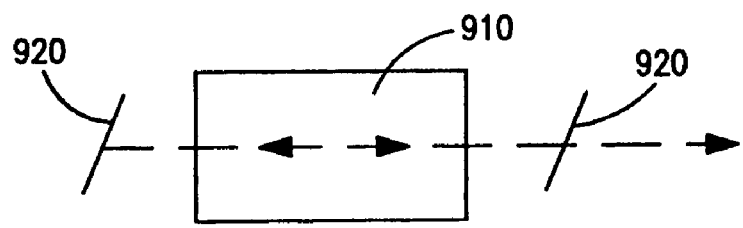
FIG. 3 illustrates reflectors used in a bipolar transistor laser device as disclosed in the referenced PCT International Patent Application Publication WO/2005/020287.

As further described in the referenced PCT International Patent Application Publications WO/2005/020287 and WO/2006/093883, FIG. 3 illustrates the three terminal light emitting HBT, 910, in a lateral cavity, represented at 920, for operation, for example, as a lateral gain guided laser. The lateral cavity may be defined, for example, by cleaved edges on or near the light emitting region. As further described in the referenced PCT Published Patent Applications, and as will be understood throughout the present application, vertical cavity laser configurations can also be employed.

As also described in the referenced PCT International Patent Application Publications WO/2005/020287 and WO/2006/093883, stimulated emission can be employed to advantage in the base layer of a bipolar transistor (e.g. a bipolar junction transistor (BJT) or a heterojunction bipolar transistor (HBT), in order to enhance the speed of the transistor. Spontaneous emission recombination lifetime is a fundamental limitation of bipolar transistor speed. The base layer of a bipolar transistor is adapted to enhance stimulated emission (or stimulated recombination) to the detriment of spontaneous emission, thereby reducing recombination lifetime and increasing transistor speed. At least one layer exhibiting quantum size effects, preferably a quantum well or a layer of quantum dots, preferably undoped or lightly doped, is provided in the base layer of a bipolar transistor. Preferably, at least a portion of the base layer containing the at least one layer exhibiting quantum size effects, is highly doped, and of a wider bandgap material than said at least one layer. The at least one quantum well, or, for example, layer of quantum dots, within the higher gap highly doped material, enhances stimulated recombination and reduces radiative recombination lifetime. A two-dimensional electron gas ("2-DEG") enhances carrier concentration in the quantum well or quantum dot layer, thereby improving mobility in the base region. Improvement in base resistance permits reduction in base thickness, with attendant reduction of base transport time. These advantages in speed are applicable in high speed bipolar transistors in which light emission is utilized, and/or in high speed bipolar transistors in which light emission is not utilized. In light emitting bipolar transistor devices, for example heterojunction bipolar transistors of direct bandgap materials, the use of one or more layers exhibiting quantum size effects can also be advantageous in enhancing light emission and customizing the emission wavelength characteristics of the devices. Doped or highly doped quantum size regions can also be utilized.

Figure 4:
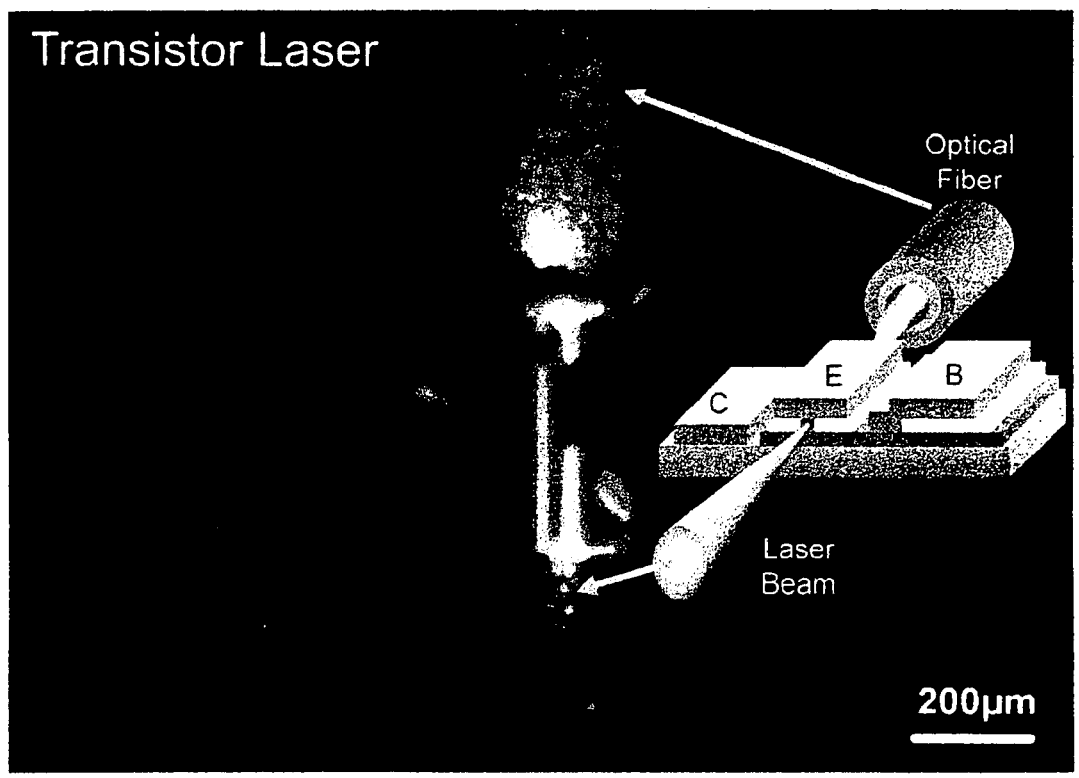
FIG. 4 shows a picture of a transistor laser in operation at 3 GHz, captured using a CCD camera.

FIG. 4 shows a picture of a transistor laser in operation, as described in detail in the above-referenced PCT International Patent Application Publication WO/2006/093883. In FIG. 4, the transistor laser, operating at 3 GHz, is photographed using a CCD camera. The light emission from the front Fabry-Perot facet was coupled (upward in FIG. 4) into an optical fiber.

Figure 5:
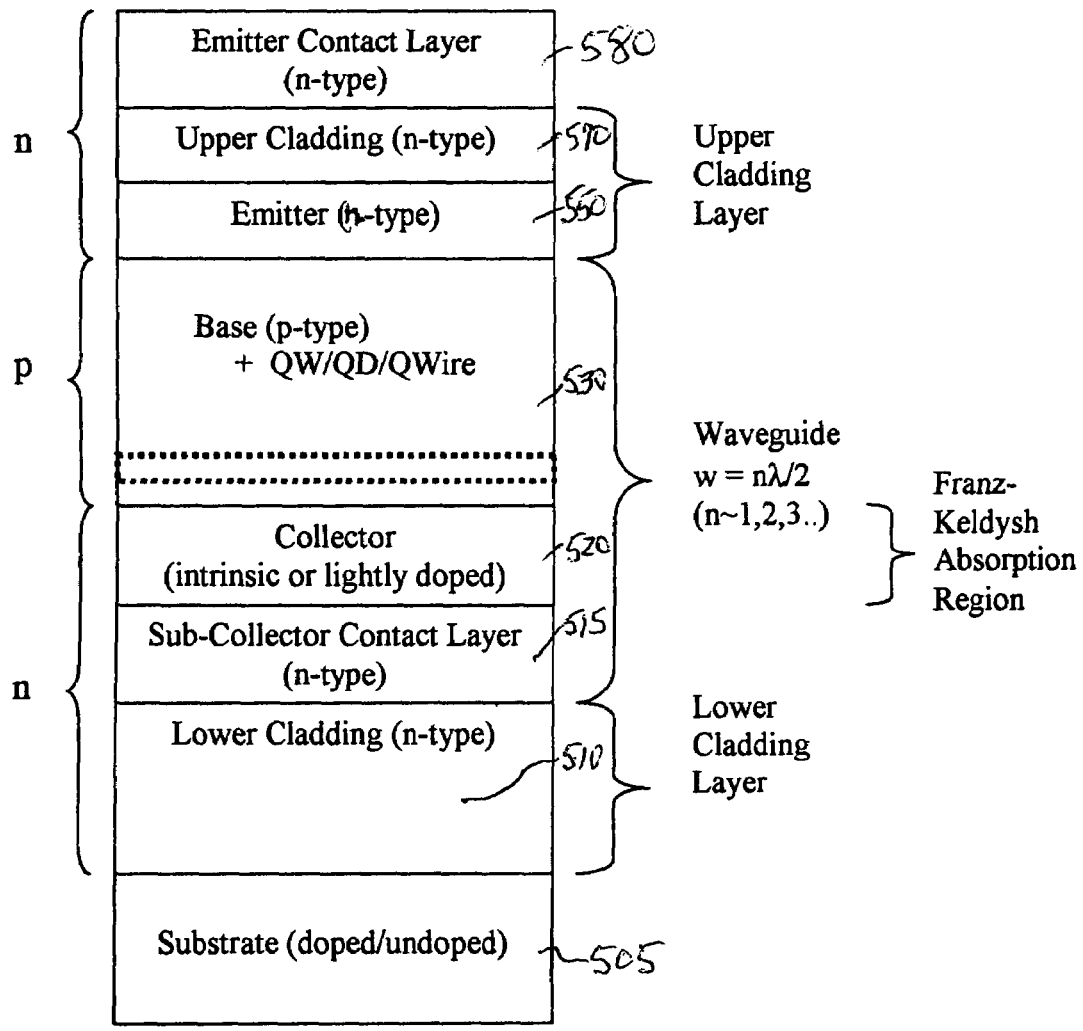
FIG. 5 is a diagram, not to scale, of the epitaxial layer structure of a type of device that can be utilized in practicing embodiments of the invention.

FIG. 5 shows the general epitaxial layers of a type of device that can be utilized in practicing embodiments and techniques hereof, and which can be modified to implement other embodiments and techniques hereof. In the simplified device diagram of FIG. 5, a substrate, which may be doped or undoped, is represented at 505, and has the following layers disposed thereon. A lower cladding layer, which is n-type in this example (it being understood, throughout, that, where suitable, devices of opposite conductivity type can be employed), is represented at 510. Then, an n-type sub-collector contact layer is represented at 515, and an intrinsic or lightly doped n-type collector layer is represented at 520. Next, a p-type base region, which preferably exhibits quantum size effects (e.g. by virtue of its own dimensions and/or by inclusion of one or more quantum well(s) and/or layer(s) of quantum dots and/or quantum wires), is represented at 530. Disposed thereon are n-type emitter 550, n-type upper cladding 570, and an n-type emitter contact layer, represented at 580. Contacts and leads for application of signals are applied to the sub-collector contact layer 515, the base layer 530, and the emitter contact layer 580. For operation as a laser, a resonant cavity is provided.

Some of the theory relating to embodiments hereof will next be treated. The effect of a medium on a wave (of wavelength $\lambda_0$) propagating in it can be represented by the complex dielectric constant ($\in$) or the complex index of refraction ($\tilde{n}$). The real part of the index of refraction (n) determines the material's polarizability, the velocity of the wave and the wavelength in the medium ($\lambda_m$). On the other hand, the imaginary component (k) determines the absorption ($\alpha$) of the medium. Some of the operative relationships are:

$$\in(\omega) = \tilde{n}^2$$

$$\tilde{n} = n + ik$$

$$\alpha = 4\pi k / \lambda_0$$

$$\lambda_m = \lambda_0 / n$$

where $\omega$ is angular frequency. The direct application of an electric field (voltage) across a medium results in the perturbation or modification of the real and imaginary refractive indexes. These effects are known as electro-optic effects. Modification of the real refractive indices is known as electrorefraction and modification of the imaginary refractive indices in the presence of the electric field is known as electroabsorption. There are four well known electric field induced complex index of refraction changes, as follows: Pockels effect (linear electro-refraction effect; $\Delta n \propto E$); Kerr effect (quadratic electro-refraction effect; $\Delta n \propto E^2$); Franz-Keldysh effect (electro-absorption and electrorefraction effects); and Quantum Confined Stark effect (electro-absorption in quantum structures). Varying the strength of the electric field (voltage), varies the strength of the above effects. If the electric field is modulated, then it follows that the effects will modulate accordingly.

As demonstrated herein, electroabsorption due to the Franz-Keldysh effect plays an important role in the operation of a direct-bandgap (base region) transistor, and in the operation of a transistor laser. Franz-Keldysh effect can result from the built-in electric field of a semiconductor P-N junction. However, the charge-depleted region of the collector-base junction of a transistor can be controlled to be made more (or less) absorptive to incident photons, including self-generated photons (that is, the recombination radiation of the device), that are lower in energy than the collector bandgap energy when large transistor reverse bias voltage is applied. When no voltage or forward bias voltage is applied across the base-collector junction, the photon absorption property is greatly reduced.

In a transistor laser structure, e.g. in FIG. 5, the Franz-Keldysh absorption region is located mainly in the intrinsically or lightly doped collector region of the transistor. In embodiments hereof, the collector region is an important section of the optical waveguide region of the transistor laser where it is strongly coupled to the optical field maximum. In a form hereof, the photon-assisted tunneling absorption is controlled under either common-emitter or common-base transistor bias conditions.

Figure 6:
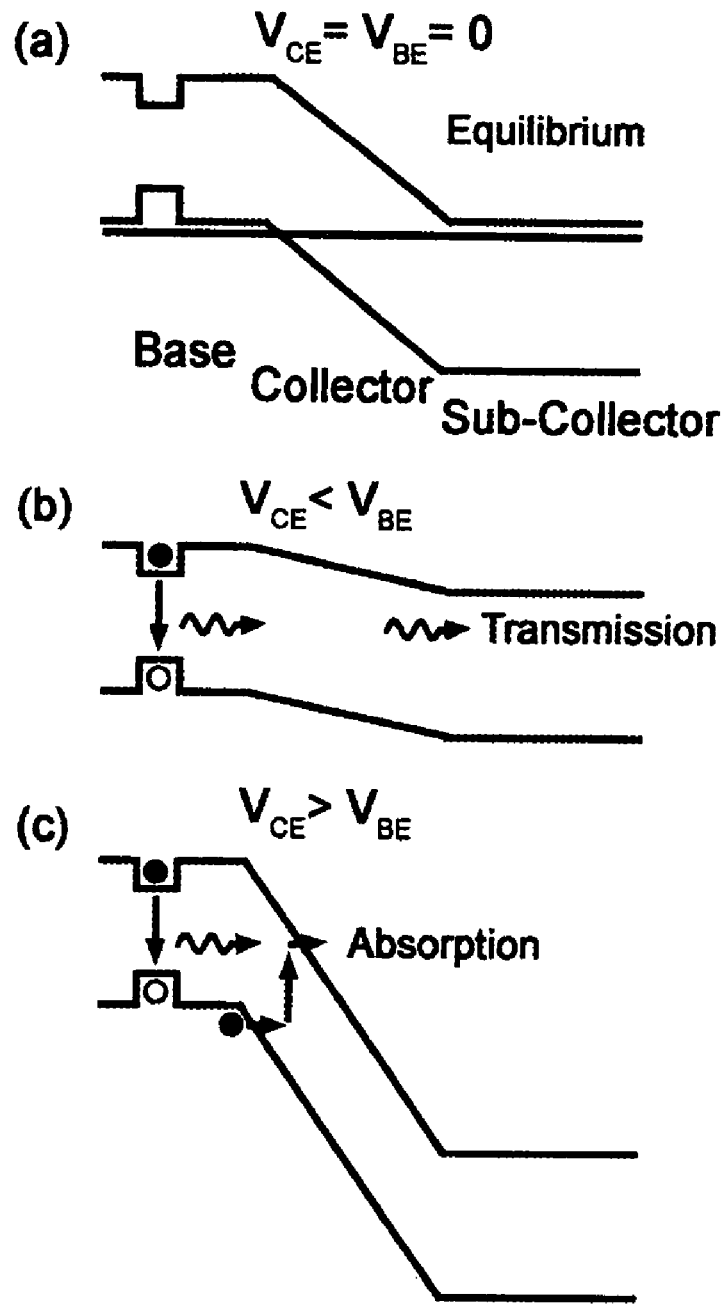
FIG. 6, which includes diagrams 6(*a*), 6(*b*) and 6(*c*), shows band diagrams that illustrate different states of operation of a laser transistor, including photon-assisted tunneling. The diagram of FIG. 6(*a*) shows a transistor laser configuration with a QW p-type base and an intrinsic collector and n-type sub-collector forming a p-i-n junction (base-collector junction). The diagram of FIG. 6(*b*) shows electron-hole pairs recombining in the quantum well (QW), emitting photons with energy smaller than the bandgap of the collector. When no reverse bias is applied, the photons are minimally absorbed (transmitted).

The band diagrams (a), (b), and (c) of FIG. 6 illustrate how photon-assisted tunneling is used to advantage in embodiments hereof. The diagram of FIG. 6(a) shows a transistor laser configuration with a p-type base having a quantum well and an intrinsic collector and n-type sub-collector forming a p-i-n junction (base-collector junction). There is no applied bias voltage. The diagram 6(b) shows the situation with $V_{CE} < V_{BE}$. Electron-hole pairs recombining in the quantum well (QW) emit photons with energy smaller than the bandgap of the collector. When no reverse bias is applied, the photons are minimally absorbed (i.e., transmitted). The diagram of FIG. 6(c) shows what occurs when a large enough field (reverse bias) is applied across the depletion region ($V_{CE} > V_{BE}$). The resultant band steepness results in photon-assisted tunneling; i.e., the photons are absorbed with Franz-Keldysh-effect assistance. The larger the field, the higher the absorption coefficient.

Applications have shown that if the base region cavity Q (the reflection at the cleaved end mirrors) of a transistor laser is enhanced, the transistor laser threshold ($I_B = I_{th}$) can be reduced to quite low values before collector bias and photon-assisted tunneling cause breakdown (see e.g. G. Walter, A. James, N. Holonyak, Jr., M. Feng, and R. Chan, Appl. Phys. Lett. 88, 232105 (2006)). Near the breakdown boundary, because of the bias and photon-assisted-tunneling, the device switches from coherent to spontaneous (c/i) optical field, to lesser slope $\Delta I_C / \Delta V_{CE}$ until total breakdown at still higher voltage. At higher base currents $I_B$ (more optical signal), it is able to switch at lower voltage from single mode (high field) to multi-mode operation (c/c) and lower average optical field.

Because of the three terminal device constraint, $I_E + I_B + I_C = 0$, along with the transistor switching condition $\alpha \rightarrow 1$, (see e.g. S. L. Miller and J. J. Ebers, Bell Syst. Tech. J. 34, 883 (1955); J. L. Moll, M. Tanenbaum, J. M. Goldey, and N. Holonyak, Proc. IRE 44, 1174 (1956)), which here is a self-generated internal-feedback photon-assisted tunneling mechanism (not an avalanche or trap-filling mechanism), the transistor laser does not merely breakdown but switches (discontinuous) through a negative resistance region from higher voltage to lower fixed voltage and higher current, and from higher to lower optical output. At lower voltage (before breakdown) and sufficient base current $I_B$, instead of discontinuous switching, smooth negative resistance ($\alpha \rightarrow 1$) is manifested in the $I_C - V_{CE}$ characteristics at lower temperature. The transistor lasers used in examples have a current gain $\beta = \Delta I_C / \Delta I_B \sim 0.24$ below threshold, a deliberately low value in order to reduce bias-current heating.

HBT laser devices used in examples hereof were made as follows (see diagram of FIG. 7). Upward from a semi-insulating GaAs substrate, the epitaxial layers of the crystal used for the HBTL of this example include a 3000 Å n-type heavily doped GaAs buffer layer (Layer 1), followed by a 634 Å n-type $Al_{0.40}Ga_{0.65}As$ layer (Layer 2), a 5000 Å n-type $Al_{0.95}Ga_{0.05}As$ layer (Layer 3), and a 150 Å n-type $Al_{0.40}Ga_{0.65}As$ layer (Layer 4) forming lower cladding layers and sub-collector layers for lateral current conduction. These layers are followed by a 200 Å GaAs n-type collector contact layer (Layer 5), a 120 Å n-type $In_{0.49}Ga_{0.51}P$ (Layer 6) etch stop layer, a 600 Å lightly doped or undoped GaAs collector layer (Layer 7), and a 1010 Å p-type AlGaAs/InGaAs/GaAs base layer (Layers 8 to 16), which includes also a 190 Å lightly doped or undoped InGaAs QW (Layers 11 to 13), designed for emission at $\lambda \approx 1000$ nm. This is followed by a heterostructure emitter comprising a 150 Å n-type $In_{0.49}Ga_{0.51}P$ layer (Layer 17). An upper confining layer is completed with the growth of a 150 Å n-type $Al_{0.35}Ga_{0.65}As$ (Layer 18), a 150 Å n-type $Al_{0.80}Ga_{0.20}As$ oxidation buffer layer (Layer 19) and a 4000 Å n-type $Al_{0.95}Ga_{0.05}As$ oxidizable layer (Layer 20), a 300 Å n-type $Al_{0.80}Ga_{0.20}As$ oxidation buffer layer (Layer 21) and a 500 Å n-type $Al_{0.35}Ga_{0.65}As$ layer (Layer 22). The HBLT laser structure is capped with a 1000 Å heavily doped n-type GaAs contact layer (Layer 23). It will be understood that some of these layers are used for convenience in device processing and are not important for device operation.

The HBTL fabrication process is performed by first patterning protective $SiN_4$ stripes (6 μm) that are used to define the emitter mesa widths. The top n-type GaAs contact layer and $Al_{0.35}Ga_{0.65}As$ transition layer are then removed by wet etching (1:8:80 $H_2O_2$:$H_2SO_4$:$H_2O$) to form the emitter mesas. This is then followed by a timed etching using 1:8:80 $H_2O_2$:$H_2SO_4$:$H_2O$ wet etch to remove part of the $Al_{0.95}Ga_{0.05}As$ layer. Next, 11 μm protective photoresist (PR) stripes are centered over the emitter mesas and the unprotected layers are then removed with a 1:8:80 $H_2O_2$:$H_2SO_4$:$H_2O$ selective wet etching solution, revealing the n-type $In_{0.49}Ga_{0.51}P$ wide-gap emitter layer. The protective photoresist (PR) stripe is then removed and the sample is oxidized for 7 min at 425° C. in a furnace supplied with $N_2+H_2O$, resulting in a ~0.9 μm lateral oxidation which forms ~2.2 μm oxide-defined apertures in the emitter mesas. This helps define and improve the current path at the emitter edge and improves the optical waveguide along the emitter. The samples are annealed (in $N_2$) at 425° C. for 7 minutes to reactivate p-dopants before the protective $SiN_4$ is removed. The emitter layer, $In_{0.49}Ga_{0.51}P$, is then removed using a wet etch (HCl), which expose the p-type GaAs base contact layer. A 37 μm PR window, is then patterned to form the base mesa for the base contact. The base layers and collector layer are then removed using a selective etch (10:1 $C_6H_8O_7$:$H_2O_2$), and the $In_{0.49}Ga_{0.51}P$ etch-stop layer is removed by a wet etch (HCl), exposing the heavily doped n-type GaAs collector contact layer. Later, a 7 μm PR window is formed over the emitter mesa and oxide layer, and a 20 μm PR window is formed over the collector material to deposit AuGe/Ni/Au (750/150/10000 Å) and form n-type metal contacts to the emitter contact layer and to the collector contact layer. Next, a 5 μm PR window is formed over the base mesa, followed by a Ti/Au (150, 10000 Å) metal deposition for contacts. The sample is then annealed at 350° C. to form the ohmic contacts. Exposed surfaces are then passivated using a combination of polyimide and silicon nitride. Via hole openings through the passivation layers to expose the emitter, base, and collector metals are defined using a photoresist (PR) step followed by a $CF_4$ etch, PR removal step and an $O_2$ plasma etch. Next, another PR step is performed to deposit Ti/Au (150 Å/2.5 μm) to form contacts from the device. The sample is then lapped to a thickness of ~50 μm. The HBTL samples are cleaved normal to the emitter stripes to form Fabry-Perot facets for the laser cavity, and the substrate side of the crystal is alloyed onto Cu heat sinks coated with In for device operation and testing.

Figure 8:
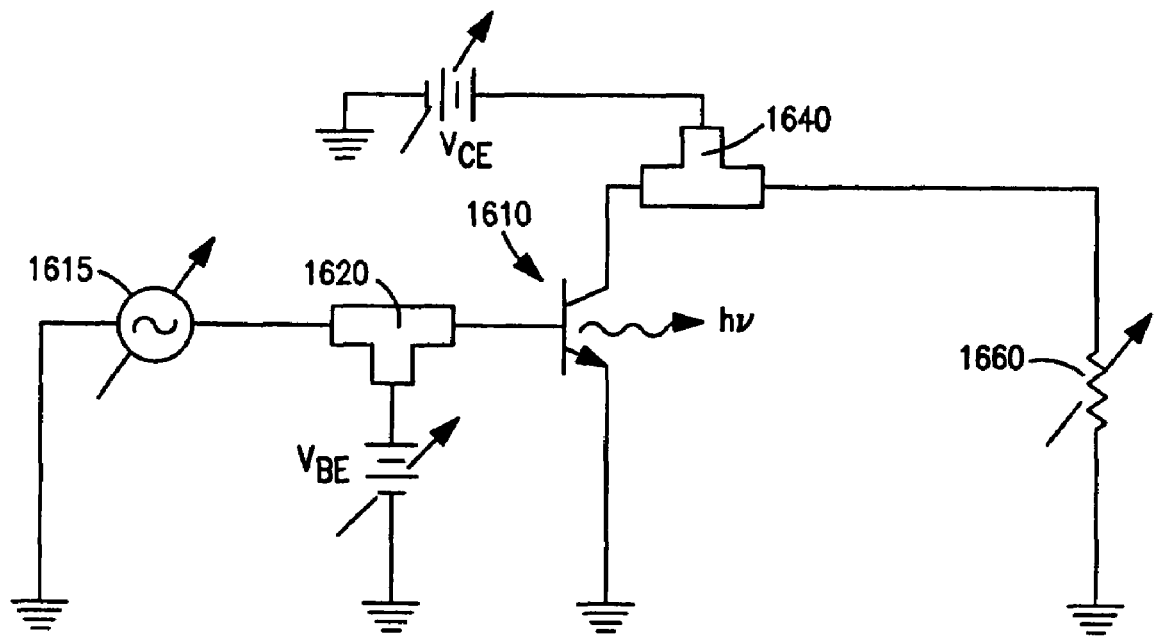
FIG. 8 is a schematic diagram of an example of a circuit that can be used to operate a laser transistor in accordance with embodiments hereof.

FIG. 8 is a diagram of an example of a circuit that can be used to operate a laser transistor (LT) 1610, under various conditions, including conditions employed in examples of embodiments hereof. In this example, an input signal from signal generator 1615 (for example, a constant current source) is coupled to the base terminal of the LT via a bias tee 1620, and the middle branch of the bias tee 1620 is coupled to a controllable bias voltage $V_{BE}$. The emitter terminal is coupled to ground reference potential and the collector terminal is coupled, via a bias tee 1640, to a variable load resistor 1660. The middle branch of the bias tee 1640 is coupled to controllable bias potential $V_{CE}$.

Figure 9:
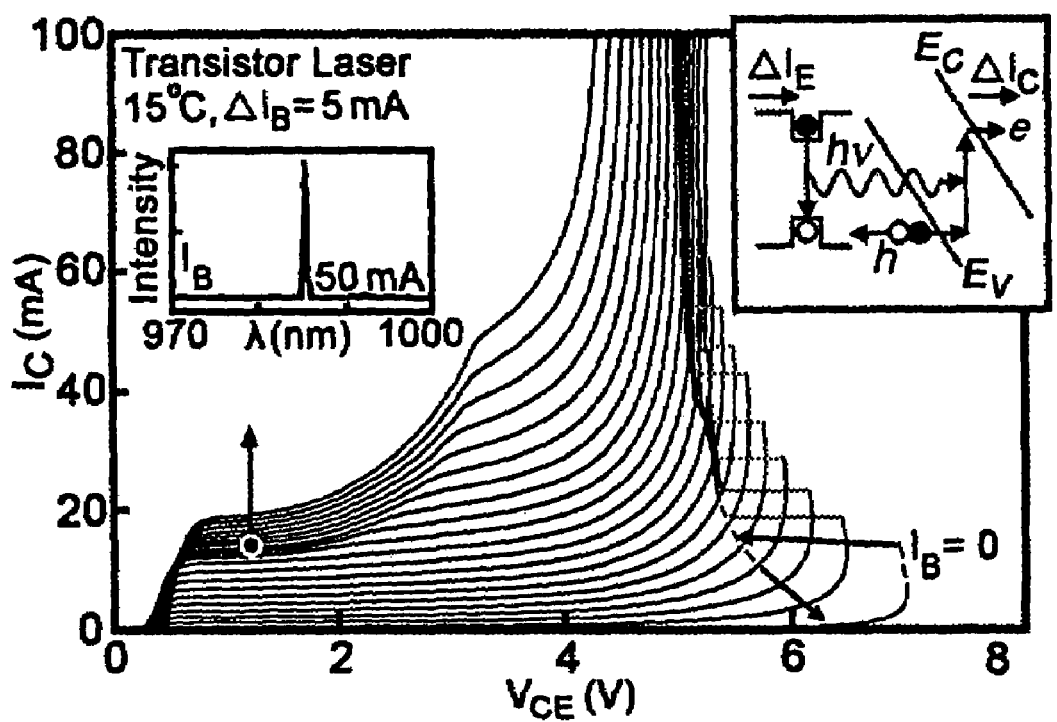
FIG. 9 shows collector $I_C$–$V_{CE}$ characteristics of a transistor laser with 6 µm wide emitter and 450 µm Fabry-Perot cavity length operating at 15° C. Breakdown and discontinuous switching is observed for α→1 ($\alpha=\Delta I_C/\Delta I_E$, $I_E+I_B+I_C=0$), from higher to lower voltage and higher current, which ($V_{CE}$) is lower at higher base current $I_B$. The left-hand inset shows the laser spectrum in the lower bias ($V_{CE}$) gain-compression region (lower $\beta=\alpha/[1-\alpha]$) at base current $I_B=50$ mA. The diagram in the upper right inset shows the tunneling process of photon generation and regeneration at the collector and nearby quantum well leading to α→1 and breakdown.

FIG. 9 shows the $I_C$-$V_{CE}$ characteristics of the laser transistor. The upper left hand corner shows the expected compression and reduction in β gain, which agrees with the corresponding laser operation shown in the upper left inset. Gain compression and laser threshold can be "pushed" to much lower current $I_B$ and higher voltage (see e.g. G. Walter, A. James, N. Holonyak, Jr., M. Feng, and R. Chan, Appl. Phys. Lett. 88, 232105 (2006)), perhaps eventually as far as the breakdown region (>6 V) shown in FIG. 9, where in the present devices entirely new features appear, including discontinuous switching (see e.g. S. L. Miller and J. J. Ebers, Bell Syst. Tech. J. 34, 883 (1955); J. L. Moll, M. Tanenbaum, J. M. Goldey, and N. Holonyak, Proc. IRE 44, 1174 (1956)) ($\alpha \rightarrow 1$, $I_E+I_B+I_C=0$) from higher to lower voltage, and to higher current.

Figure 10:
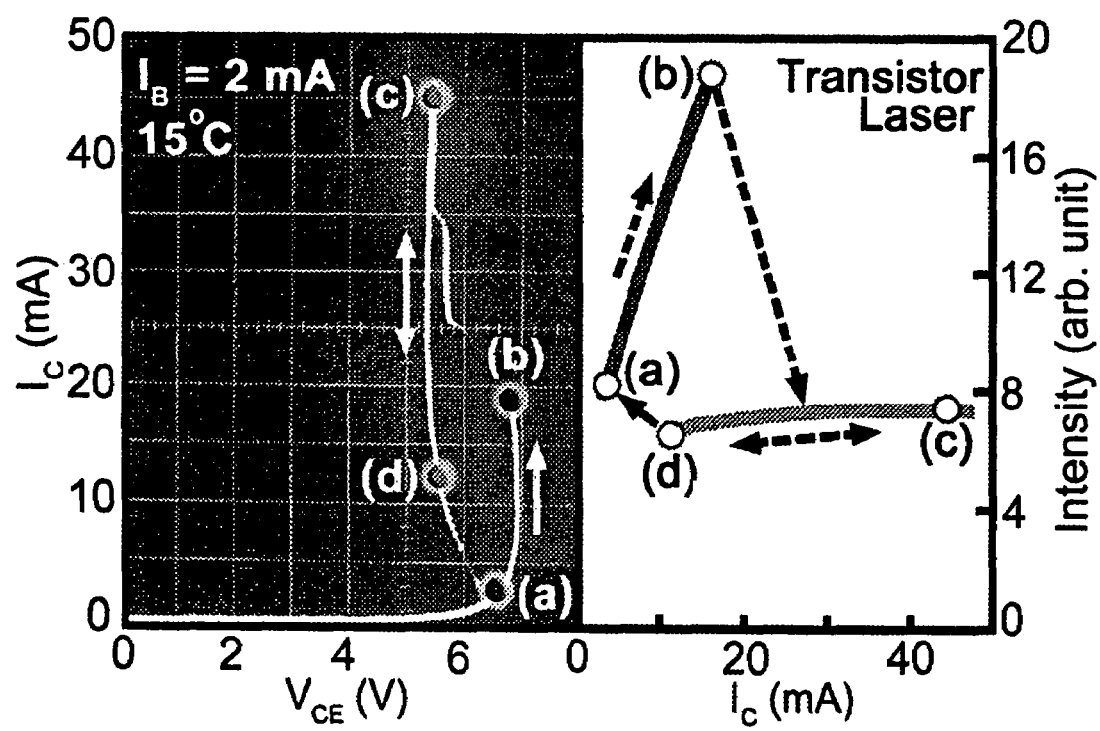
FIG. 10 shows a curve-tracer plot of the $I_B=2$ mA $I_C$–$V_{CE}$ characteristic of FIG. 9 showing in detail the α→1 breakdown behavior and in the second panel the light intensity corresponding to points (a), (b), (c) and (d) of the I-V trace. The light intensity from (a) to (b) agrees with $\Delta I_C=\Delta I_E=\Delta I_{hv}$.
Figure 11:
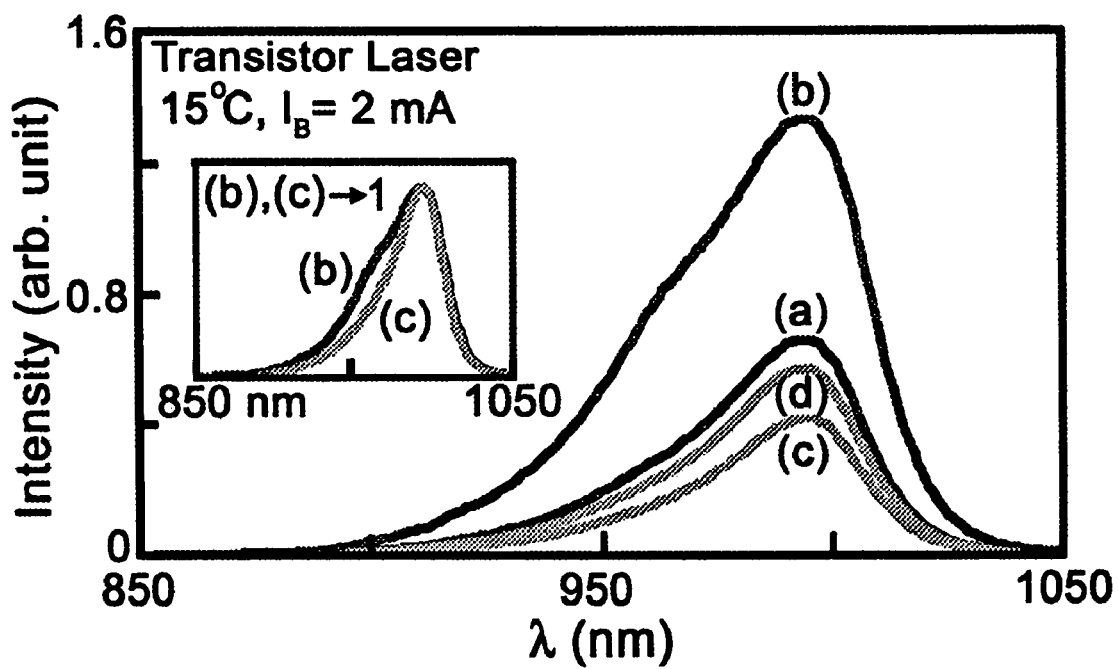
FIG. 11 shows the spectral curves corresponding to the data points of the second panel of FIG. 10. The normalized spectral curves (a) and (c) of the inset, with higher and lower intensity compared, show little change in form.

FIG. 10 shows a curve-tracer plot of the $I_B$=2 mA $I_C$-$V_{CE}$ characteristic, and in the second panel the light intensity at points (a), (b), (c) and (d) of the I-V trace. Before breakover, from (a) to (b), the light intensity increases progressively with $I_C$, but decreases after switching to lower voltage (from ~7 to ~5.5 V), and then tends to stabilize, (c) to (d), in a region of vertical $I_C$ ($\Delta I_C=\Delta I_E$, $\Delta I_B=0$, $\Delta V_{CE}\approx 0$). At higher and higher bias $I_B$ (and more recombination radiation), the breakdown voltage $V_{CE}$ moves inward to lower value. Note that the change in light intensity $\Delta I_{hv}$ from (a) to (b) agrees with $\Delta I_C=\Delta I_E=\Delta I_{hv}(\Delta I_B=0)$, which is in accord with the photon-assisted tunneling process shown in the right-hand inset of FIG. 9, and previously described in conjunction with FIG. 6. The spectral curves (FIG. 11) agree in amplitude with the data of the second panel of FIG. 10 and do not vary substantially in form, as shown by the (b) and (c) normalizations in the inset. The combination of light intensity, bias voltage, and heating tend to stabilize the voltage and light intensity after switching ($\alpha=\Delta I_C/\Delta I_E$, $\alpha \rightarrow 1$, $I_E+I_B+I_C=0$, $\Delta I_C \approx \Delta I_E$, $\Delta V_{CE}\approx 0$).

Figure 12:
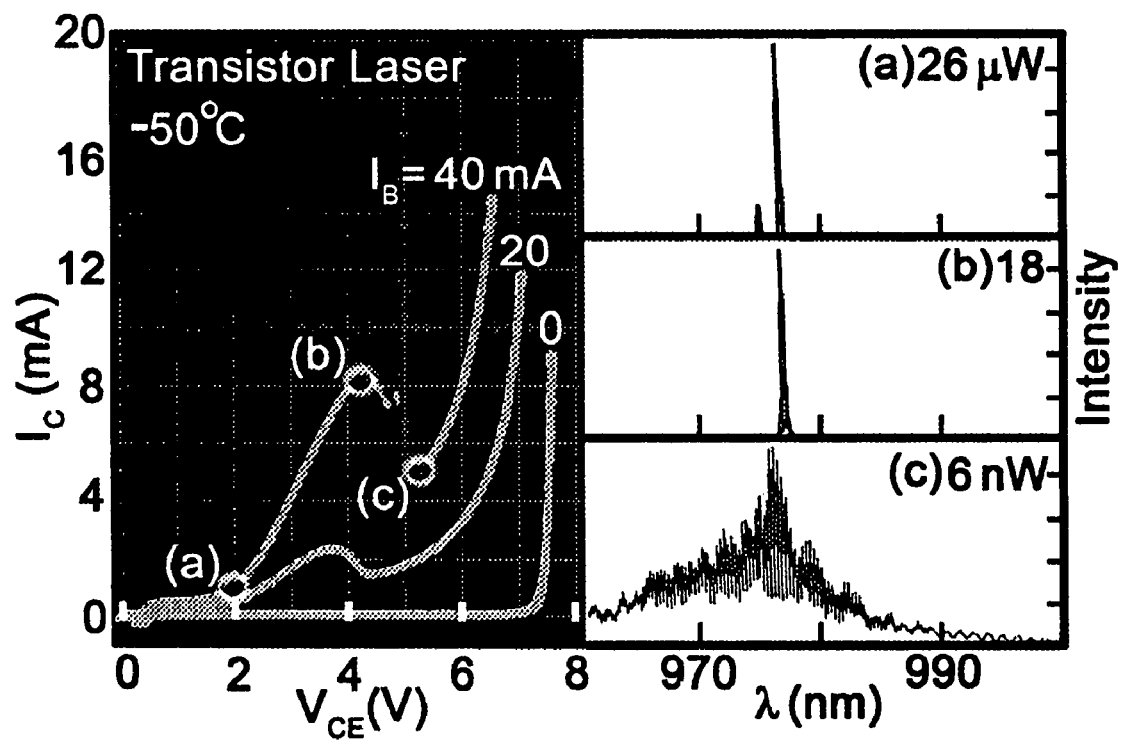
FIG. 12 shows a curve-tracer plot (left panel) of the $I_C$–$V_{CE}$ characteristics of a transistor laser with 6 µm wide emitter and 450 µm Fabry-Perot cavity length operating at −50° C. In the negative resistance region at $I_B=40$ mA, between points (b) and (c), the recombination radiation changes from coherent to spontaneous and decreases in amplitude as shown by the (a), (b), (c) spectral curves on the right.

At lower temperature (FIG. 12, −50° C.) the laser threshold $I_B$ is reduced and extends to higher voltage, to the region of the negative resistance valley of FIG. 12. The base current $I_B$ is obviously an important parameter in setting the recombination-radiation level, which also depends on $V_{CE}$. The recombination radiation spectra at (a), (b), and (c) for $I_B$=40 mA are shown at the right. From (b) to (c), near the valley of the negative-resistance, the recombination-radiation spectrum shifts from coherent to spontaneous (c/i) and to much lower amplitude (~30 dB), but from (a) to (b) stays coherent and reduces in amplitude only ~1 dB. It decreases further in amplitude and broadens at higher $V_{CE}$ (data not shown), photon-assisted tunneling playing a lesser role at lesser light intensity.

The transistor laser is unique in its capability to shift from spontaneous to stimulated base recombination ($I_B>I_{TH}$, to coherent signal), and to generate negative resistance or switch ($\alpha \rightarrow 1$, $\alpha=\Delta I_C/\Delta I_E$, $I_E+I_B+I_C=0$) under the influence of its own optical signal. A diagram of the process in the base-collector region is shown in the right hand inset of FIG. 9. The transistor laser generates and regenerates its own optical signal, consistent with photon-assisted tunneling at the collector. Note that the optical field is not decoupled, in fact, is strongly coupled to the collector, to the tunneling and the photon generation and regeneration process shown in the inset at the upper right in FIG. 9. Recombination radiation from the base QW is the source of the photon-assisted tunneling (absorption), which feeds holes into the base to maintain recombination and leads to $\Delta I_C = \Delta I_E$ ($\alpha \to 1$, $\Delta I_B = 0$, $I_B$=constant) and switching. If the process is tuned properly (recombination and absorption), which is self adjusting, the device sustains the process with $\Delta I_B = 0$ ($\alpha \to 1$).

In essence, the transistor laser is able to "make", store, and use photons. Depending on temperature and the device, the transistor laser exhibits (in the $I_C$-$V_{CE}$ characteristics) corners, negative resistance, switching, vertical collector current ($\Delta V_{CE} \approx 0$), spectral change (coherent/incoherent, c/i or i/c), and mode hopping (c/c) effects, all mediated by photon-assisted collector tunneling. Among its various other properties, the transistor laser is capable of unity-alpha ($\alpha \to 1$, $\alpha = \Delta I_C/\Delta I_E$, $\Delta I_E = \Delta I_C = \Delta I_{h\nu}$) photon generation and regeneration, and consequently switching breakdown and negative resistance. It will be understood that reduction of the applied signal (including, if desired, decrease of the applied signal during, for example, a part of a cycle), can have the effect of decreasing photon-assisted tunneling.

The invention claimed is:

1. A method for controlling operation of a transistor, comprising the steps of:
   providing a bipolar transistor having emitter, base and collector regions;
   applying electrical signals to said transistor to produce light emission from the transistor; and
   effecting photon-assisted tunneling of carriers in said transistor with self-generated photons of said light emission, and controlling operation of said transistor by controlling said photon-assisted tunneling.

2. The method as defined by claim 1, wherein said step of controlling said photon-assisted tunneling includes applying a control signal voltage to said transistor to render the collector junction of said transistor more absorptive to said self-generated photons of said light emission.

3. The method as defined by claim 2, wherein said step of applying said control signal voltage comprises applying an increase in emitter-collector voltage to said transistor to render the collector junction more absorptive to said self-generated photons of said light emission.

4. The method as defined by claim 3, wherein said step of applying an increase in emitter-collector voltage is continued to implement a state of discontinuous switching from higher to lower emitter-collector voltage at higher collector current.

5. The method as defined by claim 3, wherein said step of applying an increase in emitter-collector voltage is implemented at substantially constant base current.

6. The method as defined by claim 1, wherein said step of providing a bipolar transistor having emitter, base, and collector regions comprises providing a heterojunction bipolar transistor having a base region thickness in the range of about 10 to 100 nm.

7. The method as defined by claim 2, wherein said step of providing a bipolar transistor having emitter, base, and collector regions comprises providing a heterojunction bipolar transistor having a base region thickness in the range of about 10 to 100 nm.

8. The method as defined by claim 1, wherein said step of providing a bipolar transistor having emitter, base, and collector regions includes providing a base region that exhibits quantum size effects.

9. The method as defined by claim 2, wherein said step of providing a bipolar transistor having emitter, base, and collector regions includes providing a base region that exhibits quantum size effects.

10. The method as defined by claim 8, wherein said step of providing a base region that exhibits quantum size effects comprises providing at least one region within the base region that exhibits quantum size effects.

11. The method as defined by claim 10, wherein said step of providing said at least one region within the base region that exhibits quantum size effects comprises providing at least one quantum well region within the base region.

12. The method as defined by claim 1, wherein said step of controlling said photon-assisted tunneling comprises enhancing said photon-assisted tunneling.

13. The method as defined by claim 1, wherein said step of controlling said photon-assisted tunneling comprises attenuating said photon-assisted tunneling.

14. The method as defined by claim 1, further comprising the step of providing an absorption layer in said collector region.

15. A method for producing controlled light emission, comprising the steps of:
    providing a bipolar transistor having emitter, base and collector regions;
    applying electrical signals to said transistor to produce light emission from said transistor; and
    effecting photon-assisted tunneling of carriers in said transistor with self-generated photons of said light emission, and controlling said light emission from said transistor by controlling said photon-assisted tunneling.

16. The method as defined by claim 15, wherein said step of controlling said photon assisted tunneling includes applying a control signal voltage to said transistor to render the collector junction of said transistor more absorptive to said self-generated photons of said light emission.

17. The method as defined by claim 16, wherein said step of applying said control signal voltage comprises applying an increase in emitter-collector voltage to said transistor to render the collector junction more absorptive to said self-generated photons of said light emission.

18. The method as defined by claim 17, wherein said step of applying an increase in emitter-collector voltage is continued to implement a state of switching from higher to lower optical output.

19. The method as defined by claim 17, wherein said step of applying an increase in emitter-collector voltage is implemented at substantially constant base current.

20. The method as defined by claim 15, wherein said step of providing a bipolar transistor having emitter, base, and collector regions comprises providing a heterojunction bipolar transistor having a base region thickness in the range of about 10 to 100 nm.

21. The method as defined by claim 15, wherein said step of providing a bipolar transistor having emitter, base, and collector regions includes providing a base region that exhibits quantum size effects.

22. A method for optical modulation comprising implementing the method of claim 15, and providing an external optical input to further control said photon-assisted tunneling.

23. The method as defined by claim 1, wherein said controlling of operation of said transistor comprises producing controlled laser emission, and further comprising the step of disposing at least a portion of the transistor in an optical cavity, and wherein said step of applying electrical signals to said transistor to produce light emission from said transistor comprises applying said electrical signals to said transistor to produce laser emission; and wherein said step of effecting photon-assisted tunneling of carriers in said transistor with self-generated photons of said light emission, and controlling operation of said transistor by controlling said photon-assisted tunneling comprises effecting photon-assisted tunneling of carriers in said transistor with self-generated photons of said laser emission, and controlling said laser emission from said transistor by controlling said photon-assisted tunneling.

24. The method as defined by claim 23, wherein at least the base region of said transistor is disposed within said cavity, and wherein said step of applying electrical signals to said transistor to produce laser emission comprises effecting stimulated emission from said base region.

25. The method as defined by claim 23, wherein said step of controlling said photon assisted tunneling includes applying a control signal voltage to said transistor to render the collector junction of said transistor more absorptive to said self-generated photons of said laser emission.

26. The method as defined by claim 25, wherein said step of applying said control signal voltage comprises applying an increase in emitter-collector voltage to said transistor to render the collector junction more absorptive to said self-generated photons of said light emission.

27. The method as defined by claim 26, wherein said step of applying an increase in emitter-collector voltage is continued to implement switching from coherent to spontaneous emission.

28. The method as defined by claim 23, wherein said step of providing a bipolar transistor having emitter, base, and collector regions comprises providing a heterojunction bipolar transistor having a base region thickness in the range of about 10 to 100 nm.

29. The method as defined by claim 23, wherein said step of providing a bipolar transistor having emitter, base, and collector regions includes providing a base region that exhibits quantum size effects.

\* \* \* \* \*